United States Patent
Feldmann et al.

(10) Patent No.: US 11,850,934 B2
(45) Date of Patent: Dec. 26, 2023

(54) MOTOR VEHICLE AND METHOD FOR OPERATION OF A COOLING DEVICE

(71) Applicant: AUDI AG, Ingolstadt (DE)

(72) Inventors: Uwe Feldmann, Nassenfels (DE); Rüdiger Fischer, Gerolfing (DE); Arnold Grochla, Neuburg (DE)

(73) Assignee: Audi AG, Ingolstadt (DE)

( * ) Notice: Subject to any disclaimer, the term of this patent is extended or adjusted under 35 U.S.C. 154(b) by 29 days.

(21) Appl. No.: 17/516,459

(22) Filed: Nov. 1, 2021

(65) Prior Publication Data

US 2022/0134866 A1  May 5, 2022

(30) Foreign Application Priority Data

Nov. 2, 2020  (DE) .......................... 102020128728.3

(51) Int. Cl.
*B60K 11/00* (2006.01)
*B60K 11/02* (2006.01)
(Continued)

(52) U.S. Cl.
CPC ................ *B60K 11/02* (2013.01); *B60K 1/00* (2013.01); *B60K 6/24* (2013.01); *B60K 6/26* (2013.01);
(Continued)

(58) Field of Classification Search
CPC .......... B60K 11/02; B60K 11/00; B60K 6/24; H01M 10/613; H01M 10/66; H01M 10/625; B60L 50/60; B60L 58/26
(Continued)

(56) References Cited

U.S. PATENT DOCUMENTS 10,457,117 B2 * 10/2019 Enomoto .................. B60H 1/24
2012/0058407 A1 * 3/2012 Harr .................. H01M 8/04014
429/439
(Continued)

FOREIGN PATENT DOCUMENTS

CN         108705956 A      10/2018
DE    10 2013 204 784 A1     9/2014
(Continued)

OTHER PUBLICATIONS

"Porsche: Wärmemanagement von Fahrzeugen mit elektrischem Antrieb", Porsche Engineering Magazin, Issue Jan. 2011, pp. 34-36 <https://docplayer.org/23033027-Porsche-engineering-magazin.html> Retrieved Oct. 29, 2020. (With Machine Translation).

*Primary Examiner* — Hau V Phan
(74) *Attorney, Agent, or Firm* — SEED INTELLECTUAL PROPERTY LAW GROUP LLP

(57) ABSTRACT

A motor vehicle comprises a drive train with an electric motor, to which a traction battery and a power electronics device comprising at least one pulse inverter are associated, and a cooling device for cooling the electric motor, the power electronics device and the traction battery, wherein the electric motor is cooled in a first cooling circuit with coolant of a first maximum temperature in the supply flow, wherein the power electronics device is cooled in a second coolant circuit, which is separate from the first coolant circuit, using coolant of a second maximum temperature in the supply flow, which is lower than the first maximum temperature.

13 Claims, 1 Drawing Sheet

(51) Int. Cl.
  *B60K 1/00*    (2006.01)
  *B60L 58/26*   (2019.01)
  *B60K 6/24*    (2007.10)
  *B60K 6/26*    (2007.10)
  *B60K 6/28*    (2007.10)
  *H02K 9/19*    (2006.01)
  *H05K 7/20*    (2006.01)
  *H01M 10/613*  (2014.01)
  *H01M 10/625*  (2014.01)
  *H01M 10/66*   (2014.01)
  *B60L 50/60*   (2019.01)
  *H02M 7/537*   (2006.01)

(52) U.S. Cl.
  CPC ............... *B60K 6/28* (2013.01); *B60L 50/60* (2019.02); *B60L 58/26* (2019.02); *H01M 10/613* (2015.04); *H01M 10/625* (2015.04); *H01M 10/66* (2015.04); *H02K 9/19* (2013.01); *H05K 7/20927* (2013.01); *B60K 2001/006* (2013.01); *B60Y 2200/92* (2013.01); *B60Y 2306/05* (2013.01); *H01M 2220/20* (2013.01); *H02M 7/537* (2013.01)

(58) Field of Classification Search
  USPC ...................................................... 180/65.21
  See application file for complete search history.

(56) References Cited

U.S. PATENT DOCUMENTS

| | | | |
|---|---|---|---|
| 2012/0090806 A1* | 4/2012 | Beschieru | B60H 1/00885 165/41 |
| 2013/0022888 A1* | 1/2013 | Vollmer | H01M 8/04067 429/434 |
| 2013/0140001 A1* | 6/2013 | Mandl | B60H 1/143 165/96 |
| 2018/0111499 A1* | 4/2018 | Wada | B60K 1/04 |
| 2018/0111500 A1* | 4/2018 | Ogaki | H01M 10/6568 |
| 2019/0068028 A1  | 2/2019 | Tominaga et al. | |
| 2019/0077392 A1* | 3/2019 | Fujita | F28F 27/00 |
| 2020/0203787 A1* | 6/2020 | Honjo | H01M 10/6563 |
| 2020/0276899 A1* | 9/2020 | Gramann | B60K 1/00 |
| 2020/0290427 A1* | 9/2020 | Watanabe | H01M 10/613 |

FOREIGN PATENT DOCUMENTS

| | | |
|---|---|---|
| DE | 11 2013 002 657 T5 | 3/2015 |
| DE | 10 2016 100 861 A1 | 8/2016 |
| DE | 10 2018 108 623 A1 | 10/2018 |
| DE | 10 2018 209 340 B3 | 4/2019 |
| DE | 10 2019 210 577 A1 | 1/2021 |
| DE | 10 2019 214 082 A1 | 3/2021 |

* cited by examiner

MOTOR VEHICLE AND METHOD FOR OPERATION OF A COOLING DEVICE

BACKGROUND

Technical Field

Embodiments of the invention relate to a motor vehicle, having a drive train with an electric motor, to which a traction battery and a power electronics device comprising at least one pulse inverter are associated, and a cooling device for cooling the electric motor, the power electronics device and the traction battery, wherein the electric motor is cooled in a first cooling circuit with coolant of a first maximum temperature in the supply flow. In addition, embodiments of the invention relate to a method for operating a cooling device in such a motor vehicle.

Description of the Related Art

Hybrid motor vehicles and electric motor vehicles use an electric machine (an electric motor) as a drive motor in the drive train. In this context, the electric motor may be powered by a traction battery associated with the electric motor. High voltages are usually used, for example in the range of 60 V to 1.5 kV. Accordingly, the traction battery can also be referred to as a high-voltage battery. In electric motor vehicles and so-called plug-in hybrid motor vehicles, which also have an internal combustion engine in the powertrain in addition to the electric motor, the traction battery can be charged externally via a charging device, for example, at a charging station or the like.

In order to be able to operate the electric motor using the traction energy, a power electronics device is required, which usually comprises at least one pulse inverter (PI). The pulse inverter, in turn, typically has a plurality of semiconductor switches, particularly insulated gate bipolar transistors (IGBTs), which, like the electric motor and traction battery, require cooling during operation to allow certain currents within the pulse inverter, in particular within the IGBTs. The greater the current that can be passed through the pulse inverter, the more torque is possible in the electric motor. Since the thermally relevant mass in the pulse inverter, which is to say in particular the IGBTs, is small compared to the electric motor, for example, it is less than one kilogram, it is known in the prior art, in a cooling circuit, to first cool the power electronics device in a cooling section, after which the return flow from the power electronics device is fed to a further cooling section for the electric motor, such that the return flow from the power electronics device forms the supply flow to the electric motor. From the electric motor, the coolant of the cooling device circulating in this cooling circuit is then fed back to a cooling section in which, as is known in principle, heat is extracted. For plug-in hybrid motor vehicles, for example, it is known in the prior art to provide the coolant, for example, water, at a maximum temperature of 75° C. to the power electronics device, which is to say in the coolant supply flow to the power electronics device. The slightly heated coolant is then provided to the electric motor. At such a coolant supply flow temperature of 75° C., a maximum current of 480 A, sustainable for 10 seconds, is defined for the components of the pulse inverter, in particular the IGBTs. For electric vehicles, another example proposed a maximum coolant supply flow temperature of 65° C. for the power electronics device, which allows a maximum current of 530 A in the pulse inverter that can be sustained for 10 seconds.

In this context, electric motors should not usually be operated at lower coolant temperatures, in order to, for example, achieve the lowest possible friction.

DE 10 2016 100 861 A1 relates to the control of the reduction of the power of a rectifier/inverter module (PIM). In this context, a system includes a DC battery stack, an inverter coolant circuit, first and second temperature sensors, a multiphase electrical machine, and the PIM which is connected to the battery stack and to the electrical machine. A controller may be operated to selectively reduce the output of the PIM to thereby reduce a dictated torque to the electrical machine. For this purpose, the controller estimates a junction temperature of semiconductor switches of the PIM using the temperature of a coolant, the temperature of the PIM, and a set of electrical values. The power is reduced when the temperature of the PIM exceeds a calibrated maximum temperature.

CN 108705956 A discloses a motor controller temperature control system and a corresponding method for an electric vehicle. If the temperature of IGBTs exceeds a first temperature threshold, an air cooling device is controlled to cool the motor controller. If the IGBT temperature is lower than a second temperature threshold, a liquid cooling device is used to cool the motor controller, wherein the second temperature threshold is higher than the first temperature threshold.

BRIEF SUMMARY

Some embodiments provide a comparatively improved design of a cooling device, in particular one which permits a higher output.

To solve this task, in a motor vehicle of the type mentioned at the outset, it is provided that the power electronics device is cooled in a second coolant circuit, which is separate from the first coolant circuit, using coolant of a second maximum temperature in the supply flow, which is lower than the first maximum temperature.

It was recognized that lower coolant temperatures permit higher currents in the pulse inverter, in particular in IGBTs or other semiconductor circuits of the pulse inverter, which, in turn, permit higher torques in the electric motor and thus higher drive power. Thus, in order to ensure that low temperatures can be achieved at the pulse inverter, the power electronics device is removed as the drive motor from the first cooling circuit, which uses a first, higher maximum temperature for the electric motor, which is to say the electric machine, and it is cooled in a second coolant circuit, in which the coolant with a lower maximum temperature allows cooling of the pulse inverter, in particular its semiconductor switches. Thus, for the second coolant circuit, the second maximum temperature in the supply flow to the power electronics device is lower than the first maximum temperature for the first coolant circuit, in the supply flow to the electric motor.

If one compares, for example, plug-in hybrid motor vehicles (PHEVs) known in the prior art with electric motor vehicles (BEVs) known in the prior art, there were already differences with regard to the coolant supply temperature for the electric motors, namely 75° C. for PHEVs as opposed to 65° C. for BEVs, such that differences of, for example, 50 A existed for maximum currents through the semiconductor switches, in particular IGBTs, when the power electronics device was cooled upstream of the electric motor. If, for example, a first maximum temperature of 75° C. is now also reduced for PHEVs to a second maximum temperature of 65° C. or less, correspondingly higher maximum currents are permissible in the pulse inverter. Since higher temperatures are usually present in the cooling circuit for the electric motor in plug-in hybrid motor vehicles anyway, this results in a higher achievable positive effect, such that the motor vehicle can be a plug-in hybrid motor vehicle. In a specific example, the first maximum temperature for an electric motor vehicle can be 65° C. (or more), or for a plug-in hybrid motor vehicle 75° C. (or more), whereas the second maximum temperature can, for example, be in the range of 50° C.-55° C. In general, it can be said that the at least one pulse inverter and/or at least one semiconductor switch, in particular IGBT, of the pulse inverter is operated taking into account a current limit value that can be maintained for a maximum of 10 seconds, the current limit value being chosen to be greater than a current limit value possible during cooling at the first maximum temperature and/or greater than or equal to 500 A, in particular greater than or equal to 530 A. A temperature reduction starting from the first temperature of 75° C. to a second temperature of 65° C. will already allow to increase the current limit value from 480 A to 530 A for some designs, wherein a further reduction, for example, to possible current limit values, can lead to possible values of up to 580 A or above without a risk of destruction.

In an embodiment, it may be provided that the second cooling circuit is also used for cooling the traction battery. In other words, an already existing second cooling circuit of the traction battery can also be used to add a cooling section for the power electronics device. In this case, the traction battery is usually cooled with a lower temperature in the supply flow anyway, so that a joint use of the battery coolant circuit as a second cooling circuit for the power electronics device proves to be particularly favorable. In this way, the need to create additional cooling circuits is avoided. In this, as is often the case in known motor vehicles, the traction battery and the power electronics unit can also be installed adjacent to one another in the motor vehicle, in particular even in a common assembly, so that only short, additional coolant paths are required.

In an embodiment, a cooling section of the second cooling circuit for cooling the power electronics device may be arranged in a return flow from a cooling section for the traction battery. In this way, there is no need to change the supply flow temperature for the traction battery, since there is no cooling activity upstream of the traction battery. On the other hand, it has been shown that the coolant outflowing from the cooling section for the traction battery has usually heated very little, such that a second maximum temperature in the supply flow to the power electronics device is still clearly well below the first maximum temperature in the supply flow to the electric motor, such that the advantages described herein are obtained, without the second cooling circuit of the traction battery needing to be adjusted or be controlled differently. In other words, the return flow of the traction battery is used as the supply flow for the power electronics device. If, for example, 50° C. is provided as the maximum temperature of the coolant in the supply flow to the traction battery, the second maximum temperature in the return flow from the traction battery and thus the supply flow to the power electronics device can be, for example, 55° C. or less, such that there is a significant gain, in particular compared with, for example, 65° C. or 75° C. as the first, maximum temperature in the supply flow to the electric motor.

In this context, it can also be provided that the cooling section of the power electronics device is designed for a lower coolant through-flow than the coolant section of the traction battery, wherein a volume compensation section is provided in the second cooling circuit parallel to the cooling section of the power electronics device in order to discharge excess coolant. In this way, volume compensation can be performed, since traction batteries can usually have a relatively large thermally relevant mass, for example, in the range of 100 kg to 150 kg, whereas the thermally relevant mass of semiconductor switches, in particular IGBTs, in pulse inverters is significantly lower, for example less than 1 kg.

As already mentioned, the first maximum temperature can be in the range of 60° C.-80° C., wherein the removal of the power electronics device from the cooling circuit for the electric motor can also allow higher maximum temperatures to be used in the supply flow to the electric motor. Consequently, some embodiments can provide that a temperature of greater than 75° C., in particular of greater than 85° C., is selected as the first maximum temperature in the supply flow to the electric motor. This is because it has been shown that at higher operating temperatures for the electric motor, the latter can be operated with less friction, which can lead to a reduction in power consumption.

In general, it can be said that the cooling device can also have, in addition to the cooling circuits, at least one control device for controlling the operation of the cooling device, which can regulate, for example, to the first maximum temperature and the second maximum temperature and/or temporarily a lower temperature control value, in particular as a function of temperature measurement values of at least one temperature sensor per cooling circuit. A measurement of the temperature at the elements to be cooled can also be carried out in this context. An adjustment of current control values for the first and the second cooling circuit is also, in principle, conceivable by means of the control device, wherein, however, the supply flow temperature for the power electronics device in the second cooling circuit can, in principle, remain lower than the supply flow temperature in the first cooling circuit.

As has already been mentioned, embodiments described herein can be applied to a plug-in hybrid motor vehicle which also has an internal combustion engine in the drive train. The at least one pulse inverter may include, for example, at least one IGBT as the element (and semiconductor switch) to be cooled.

In addition to the motor vehicle, some embodiments relate to a method for operating such a cooling device in a motor vehicle, wherein, as a consequence, the electric motor is cooled in the first cooling circuit with cooling water of a first maximum temperature in the supply flow to the electric motor, wherein the first maximum temperature is lower than a second maximum temperature in the supply flow to the power electronics device, which is cooled in a second cooling circuit separate from the first cooling circuit. All the statements with respect to the motor vehicle described herein can be applied in a similar manner to the method described herein, so that the advantages already mentioned can also be obtained with the latter.

BRIEF DESCRIPTION OF THE SEVERAL
VIEWS OF THE DRAWINGS

Further advantages and details will be apparent from the embodiments described below and from the drawings.

DETAILED DESCRIPTION

Figure 1:
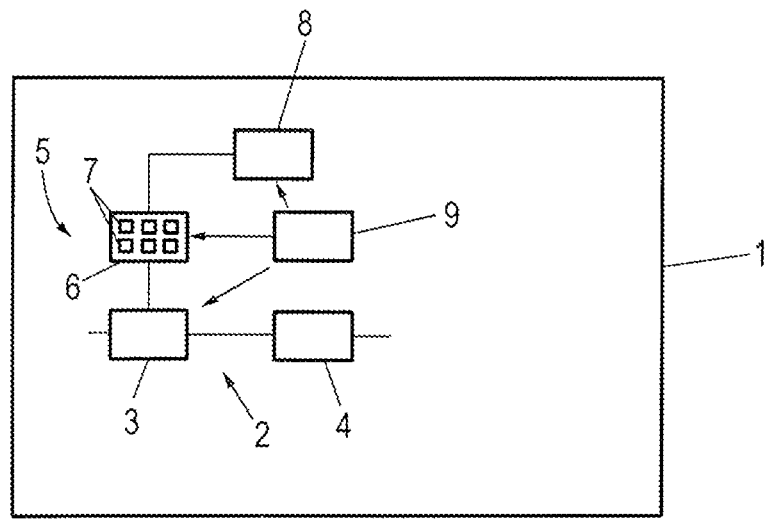
FIG. 1 shows a schematic sketch of a motor vehicle.

FIG. 1 shows a schematic sketch of a motor vehicle 1, which, in this case, is designed as a plug-in hybrid motor vehicle 1. The motor vehicle 1 comprises an electric motor 3 and an internal combustion engine 4 in a drive train 2. The features described herein can also be applied to an electric motor vehicle; in this case, the internal combustion engine 4 would be omitted.

The electric motor 4, which is designed as a conventional electric machine, is connected to a traction battery 8 (high-voltage battery) via a power electronics device 5, which comprises a pulse inverter (PI) 6 with six IGBTs 7. For cooling of the electric motor 3, of the power electronics device 5 and of the traction battery 8, the motor vehicle 1 further comprises a cooling device 9, which may also comprise a control device for controlling the operation thereof and/or at least one temperature sensor. The cooling device 9 uses cooling water as a coolant, which is circulated in cooling circuits.

Figure 2:
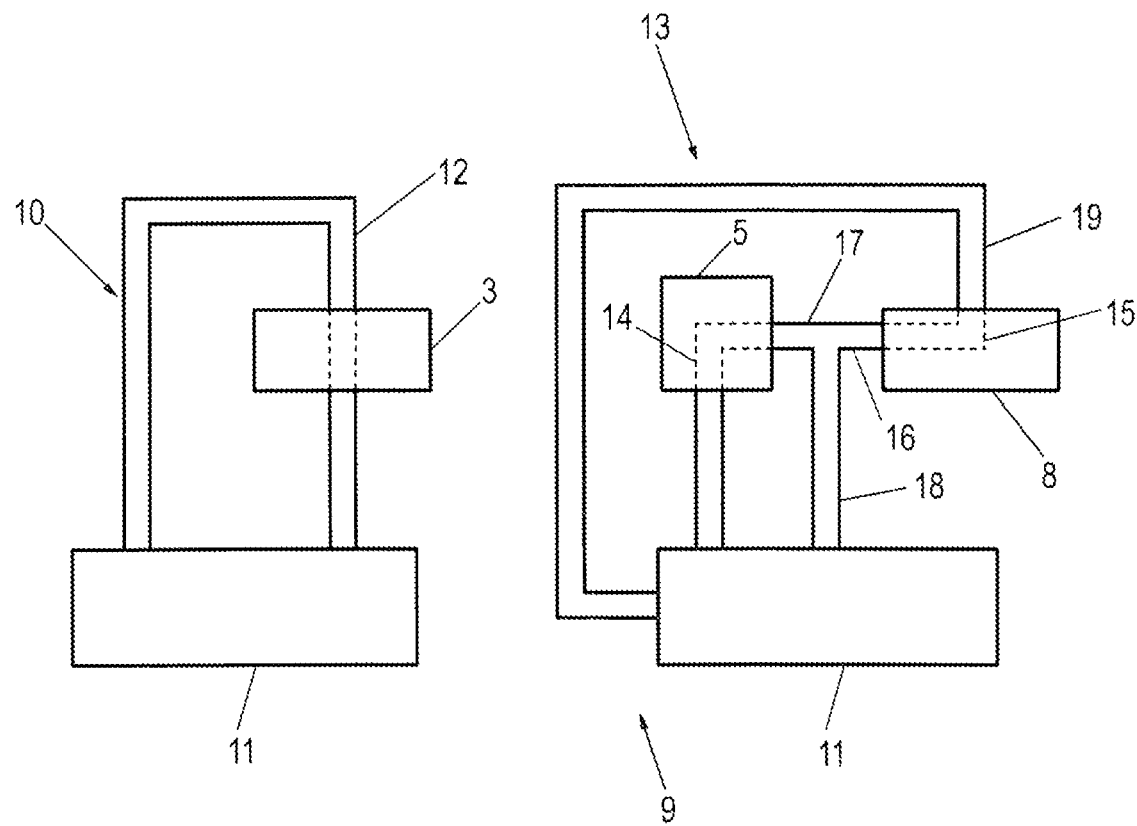
FIG. 2 shows the design of a cooling device of the motor vehicle.

FIG. 2 shows the use of cooling circuits in the cooling device 9 in more detail. Accordingly, the cooling device 9 comprises a first cooling circuit 10 which is used for cooling the electric motor 3, wherein in FIG. 2, for simplification of the illustration, only the components to be cooled are shown, however not the typical components of the cooling circuit, comprising a cooling unit and the like, which are only generically indicated as box 11.

In this respect, the first cooling circuit 10 uses coolant of a first, maximum temperature in the supply flow 12 to the electric motor 3. This first temperature may, for example, be in the range of 65° C. to 95° C., but may be chosen to be greater than 75° C., such as greater than 85° C. In this way, the electric motor 3 can be operated with less friction due to the higher temperature, which leads to a saving of electrical energy.

The second cooling circuit 13 is used for cooling of the traction battery 8 and the power electronics device 5, wherein the cooling section 14 used for cooling of the power electronics device 5 is connected downstream of the cooling section 15 used for cooling of the traction battery 8. In other words, the return flow 16 of the traction battery 8 thus simultaneously forms the supply flow 17 for the power electronics device 5. Since the thermally relevant mass of the power electronics device 5 is significantly smaller than the thermally relevant mass of the traction battery 8, less coolant through-flow and thus less coolant volume is required there, so that a volume compensation section 18 is provided.

The second cooling circuit 13 uses, in this case, a maximum supply flow temperature of 50° C. in the supply flow 19 to the traction battery 8, such that the second, maximum temperature in the supply flow 17 to the power electronics device 5 is an only slightly increased maximum supply flow temperature, for example, in the range from 51° C. to 55° C.

In this manner, the pulse inverter 6 or alternatively, more specifically, its IGBTs 7 as elements to be cooled, can be kept at a lower temperature than the electric motor 3 by, for example, 20° C. or more, which allows higher currents there. For example, the maximum current limit allowed for 10 seconds by the IGBTs 7 may be about 100 A higher than if the power electronics device 5 were cooled in the supply flow 12 to the electric motor 3. In one specific embodiment a maximum 10 second current of 580 A may, for example, be defined as opposed to 480 A at 75° C.

German patent application no. 10 2020 128728.3, filed Nov. 2, 2020, to which this application claims priority, is hereby incorporated herein by reference, in its entirety.

Aspects of the various embodiments described above can be combined to provide further embodiments. In general, in the following claims, the terms used should not be construed to limit the claims to the specific embodiments disclosed in the specification and the claims, but should be construed to include all possible embodiments along with the full scope of equivalents to which such claims are entitled.

The invention claimed is:

1. A motor vehicle, comprising:
a drive train with an electric motor;
a traction battery and a power electronics device comprising at least one pulse inverter associated with the electric motor; and
a cooling device for cooling the electric motor, the power electronics device and the traction battery;
wherein the electric motor is cooled in a first cooling circuit with coolant of a first maximum temperature in a first supply flow; and
wherein the power electronics device is cooled in a second cooling circuit, which is separate from the first cooling circuit, using coolant of a second maximum temperature, in a second supply flow, which is lower than the first maximum temperature.

2. The motor vehicle according to claim 1, wherein the at least one pulse inverter and/or at least one semiconductor switch of the pulse inverter is operated taking into account a current limit value which can be maintained for a maximum of 10 seconds, the current limit value being chosen to be greater than a current limit value possible during cooling at the first maximum temperature and/or greater than or equal to 500 A.

3. The motor vehicle according to claim 2, wherein the at least one semiconductor switch is an insulated gate bipolar transistor and wherein the current limit value is chosen to be greater than a current limit value possible during cooling at the first maximum temperature and/or greater than or equal to 530 A.

4. The motor vehicle according to claim 1, wherein the second cooling circuit is also used to cool the traction battery.

5. The motor vehicle according to claim 4, wherein a cooling section of the second cooling circuit for cooling the power electronics device is arranged in a return flow from a cooling section for the traction battery.

6. The motor vehicle according to claim 5, wherein the cooling section of the power electronics device is designed for a lower coolant through-flow than the cooling section of the traction battery, wherein a volume compensation section is provided in the second cooling circuit parallel to the cooling section of the power electronics device in order to discharge excess coolant.

7. The motor vehicle according to claim 1, wherein the traction battery and the power electronics device are installed adjacent to one another in the motor vehicle.

8. The motor vehicle according to claim 7, wherein the traction battery and the power electronics device are installed in a common assembly.

9. The motor vehicle according to claim 1, wherein a temperature of greater than 75° C. is selected as the first maximum temperature.

10. The motor vehicle according to claim 9, wherein a temperature greater than 85° C. is selected as the first maximum temperature.

11. The motor vehicle according to claim 1, wherein the motor vehicle is a plug-in hybrid motor vehicle which additionally also has an internal combustion engine in the drive train.

12. The motor vehicle according to claim 1, wherein the at least one pulse inverter contains at least one insulated gate bipolar transistor as the element to be cooled.

13. A method, comprising:
   operating a cooling device in a motor vehicle, the motor vehicle comprising:
   a drive train with an electric motor;
   a traction battery and a power electronics device comprising at least one pulse inverter associated with the electric motor; and
   the cooling device for cooling the electric motor, the power electronics device and the traction battery;
   wherein the electric motor is cooled in a first cooling circuit with coolant of a first maximum temperature in a first supply flow; and
   wherein the power electronics device is cooled in a second cooling circuit, which is separate from the first cooling circuit, using coolant of a second maximum temperature, in a second supply flow, which is lower than the first maximum temperature.

* * * * *